(12) United States Patent
Dudeck (10) Patent No.: US 10,032,516 B2
(45) Date of Patent: *Jul. 24, 2018

(54) DUO CONTENT ADDRESSABLE MEMORY (CAM) USING A SINGLE CAM

(71) Applicant: eSilicon Corporation, San Jose, CA (US)

(72) Inventor: Dennis Dudeck, Hazle Township, PA (US)

(73) Assignee: eSilicon Corporation, San Jose, CA (US)

(*) Notice: Subject to any disclaimer, the term of this patent is extended or adjusted under 35 U.S.C. 154(b) by 0 days.

This patent is subject to a terminal disclaimer.

(21) Appl. No.: 15/621,954

(22) Filed: Jun. 13, 2017

(65) Prior Publication Data

US 2017/0278569 A1 Sep. 28, 2017

Related U.S. Application Data

(63) Continuation of application No. 14/963,087, filed on Dec. 8, 2015, now Pat. No. 9,711,220.

(60) Provisional application No. 62/089,102, filed on Dec. 8, 2014.

(51) Int. Cl.
*G11C 15/00* (2006.01)
*G11C 15/04* (2006.01)
*G06F 17/50* (2006.01)

(52) U.S. Cl.
CPC .......... *G11C 15/04* (2013.01); *G06F 17/5072* (2013.01); *G06F 17/5077* (2013.01)

(58) Field of Classification Search
CPC ....... G11C 15/04; G11C 15/00; G11C 15/046; H06F 17/5077

USPC ................ 365/49.1, 49.17, 189.07
See application file for complete search history.

(56) References Cited

U.S. PATENT DOCUMENTS

| | | | |
|---|---|---|---|
| 7,643,353 B1* | 1/2010 | Srinivasan | G11C 15/00 365/189.02 |
| 9,711,220 B2* | 7/2017 | Dudeck | G11C 15/04 |
| 2002/0163637 A1 | 11/2002 | Rossman et al. | |
| 2003/0163637 A1 | 8/2003 | Villaret et al. | |
| 2008/0151588 A1 | 6/2008 | Agrawal et al. | |

OTHER PUBLICATIONS

Office Action for U.S. Appl. No. 14/963,087, dated Sep. 12, 2016, 8 Pages.

* cited by examiner

*Primary Examiner* — Son Dinh
(74) *Attorney, Agent, or Firm* — Fenwick & West LLP (57) ABSTRACT

Disclosed is a content addressable memory (CAM). The content addressable memory array includes a memory array and a data match module. The memory array includes multiple memory rows. Each memory row is configured to store a first data word and a second data word. The data match module includes a first match circuitry configured to compare a first match word to the first data word of a memory row, and to generate a first match output based on the comparison between the first match word and the first data word of the memory row. The data match module further includes a second match circuitry configured to compare a second match word to the second data word of the memory row, and to generate a second match output based on the comparison between the second match word and the second data word of the memory row.

14 Claims, 6 Drawing Sheets

DUO CONTENT ADDRESSABLE MEMORY (CAM) USING A SINGLE CAM

CROSS REFERENCE TO RELATED APPLICATIONS

This application is a Continuation of U.S. patent application Ser. No. 14/963,087, filed Dec. 8, 2015, which claims the benefit of U.S. Provisional Application No. 62/089,102, filed Dec. 8, 2014, both of which are incorporated by reference in their entirety.

BACKGROUND

1. Field of the Invention

This invention relates generally to content addressable memory (CAM). More particularly, it relates to generating multiple CAMs using a single CAM.

2. Description of the Related Art

Content addressable memory (CAM) is a type of memory unit in which the data stored is addressable by its content. During a compare operation, the CAM compares an input word with the words stored in the CAM. The CAM determines whether each entry is a match or a mismatch to the input word. If a match to the input word is found, the CAM may return a list of one or more storage addresses of the entries that matched the input word and/or one or more data words associated with the entries that matched the input word.

Some chips may include multiple CAMs. For instance, a chip may implement a CAM with a large number of rows as two separate CAMs, each having one half of the rows. Splitting a large CAM into multiple smaller CAMs increases the overall performance of the CAMs but increases the area and power consumed by the CAMs. Thus, there is a need for reducing the amount of area and power consumed by multiple CAMs in a single chip.

SUMMARY

The present invention overcomes the limitations of the prior art by combining multiple smaller CAMs into a single larger CAM. The larger CAM includes multiple match outputs per memory row. Each match output corresponds to a portion of the memory row. Since the smaller CAMs are combined into a single larger CAM, the periphery circuitry such as address decoders and registers may be shared.

In one embodiment, the larger content addressable memory array includes a memory array and a data match module. The memory array includes multiple memory rows. Each memory row is configured to store a first data word and a second data word. The data match module includes a first match circuitry configured to compare an input word to the first data word of a memory row, and to generate a first match output based on the comparison between the input word and the first data word of the memory row. The data match module further includes a second match circuitry configured to compare the input word to the second data word of the memory row, and to generate a second match output based on the comparison between the input word and the second data word of the memory row.

Other aspects include components, devices, systems, improvements, methods, processes, applications and other technologies related to the foregoing.

BRIEF DESCRIPTION OF THE DRAWINGS

The invention has other advantages and features which will be more readily apparent from the following detailed description of the invention and the appended claims, when taken in conjunction with the accompanying drawings, in which:

DETAILED DESCRIPTION

The Figures (FIGS.) and the following description relate to preferred embodiments by way of illustration only. It should be noted that from the following discussion, alternative embodiments of the structures and methods disclosed herein will be readily recognized as viable alternatives that may be employed without departing from the principles of what is claimed.

Reference will now be made in detail to several embodiments, examples of which are illustrated in the accompanying figures. It is noted that wherever practicable similar or like reference numbers may be used in the figures and may indicate similar or like functionality. The figures depict embodiments of the disclosed system (or method) for purposes of illustration only. Alternative embodiments of the structures and methods illustrated herein may be employed without departing from the principles described herein.

Figure 1:
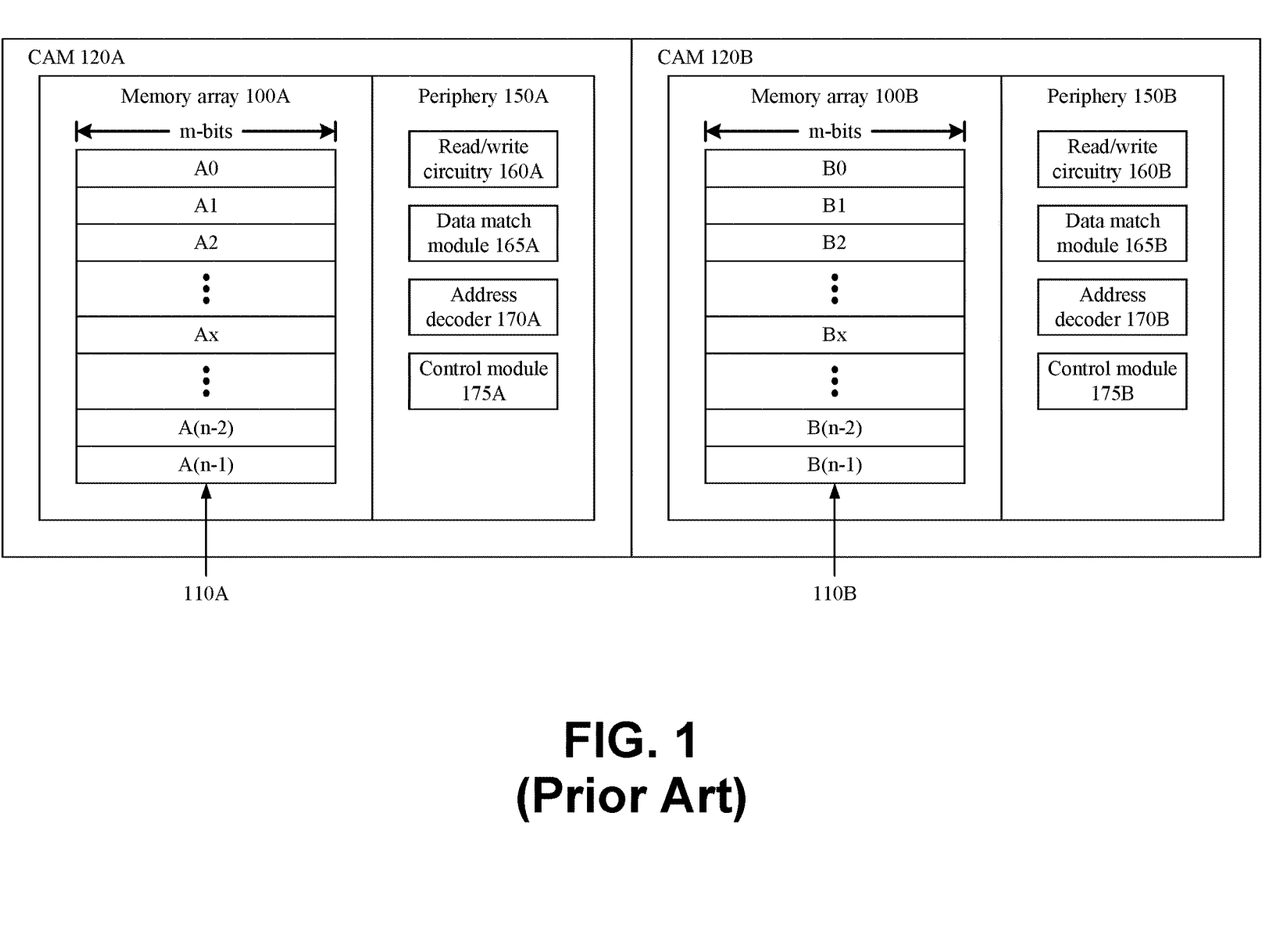
FIG. 1 (prior art) is a block diagram of a two m-bits content addressable memories (CAMs).

FIG. 1 is a block diagram of two m-bit content addressable memories (CAMs). Each CAM 120A, 120B of FIG. 1 includes a memory array 100, and periphery circuitry 150. The memory arrays 100 contain data organized as words. The periphery circuitry 150 contains auxiliary circuitry for the CAM.

The periphery circuitry 150 includes read/write circuitry 160, a data match module 165, address decoders 170, and control module 175. The read/write circuitry 160 reads data from the memory array 100 and writes data to the memory array 100. The read/write circuitry 160 may also read and write data not shown in FIG. 1. For example, data entry 110 may be an index to other data words. The read/write circuitry 160 may also read and write those other data words.

The content comparison function of the CAM is performed by the data match module 165. The data match module 165 compares the data entries 110 to an input word. In some embodiments, the data match module 165 compares an input word to every data entry 110 of the CAM in parallel and generates a match output for every data entry 110 indicating whether the input word matched the data entry.

The selection of a memory row of the memory array 100 for performing a read or write operation in the memory row is performed by the address decoder 170. The address decoder receives as an input an address of the memory row and asserts an output to enable a memory row corresponding to the input address.

The control module 175 includes additional circuitry such as address registers, timing registers, clock buffers, test circuitry (e.g. built-in self-test (BIST) circuitry), repair circuitry, and the like.

As illustrated in FIG. 1, each CAM of an integrated circuit has a corresponding periphery circuitry 150 that includes a corresponding read/write circuitry 160, data match module 165, address decoder 170, and control module 175.

Integrated circuits may combine multiple CAMs to implement large CAM. For instance, an integrated circuit that uses a CAM with 512 rows, each row having 72 bits (i.e., a 512×72 CAM) may be implemented as two CAMs with 256 rows each (i.e., two 256×72 CAMs). Some integrated circuits may split a large CAM into more than two separate CAMs. For instance, a 1024×72 CAM may be split into four 256×72 CAMs. Splitting a large CAM into multiple smaller CAMs improves the speed of the overall system. Additionally, splitting a large CAM into multiple smaller CAMs increases the total power consumed and the area occupied by the CAMs.

To reduce the power consumption and the area occupied by multiple CAMs, two or more CAMs can be combined into a wider CAM. For instance, two 256×72 CAMs may be combined into a single 256×144 CAM. Each half of the 256×144 CAM may be used as an independent 256×72 CAM, or both halves may be combined to form a 512×72 CAM. Since the two smaller 256×72 CAMs are combined into a larger 256×144 CAM, the periphery circuitry can be shared between the two smaller 256×72 CAMs. In another example, four 256×72 CAMs may be combined into a single 256×288 CAM.

Figure 2:
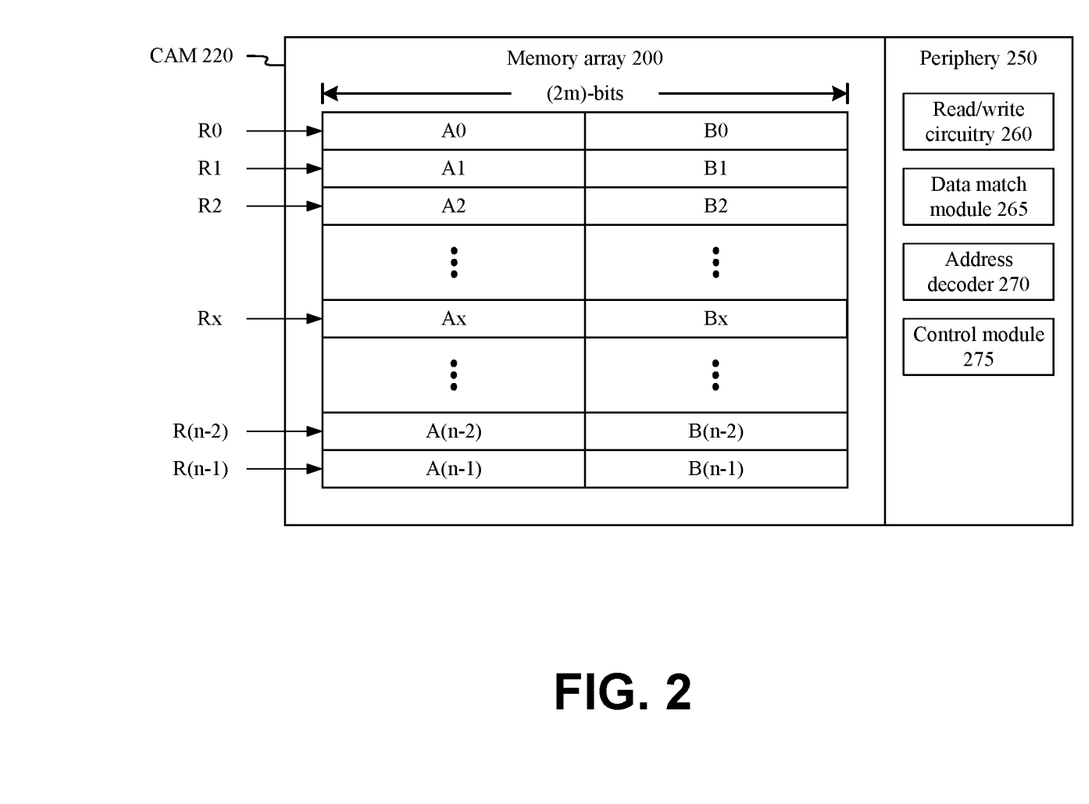
FIG. 2 is a block diagram of a 2m-bits content addressable memory being used as two m-bits CAMs, according to one embodiment.

FIG. 2 illustrates a block diagram of a 2m-bit content addressable memory being used as two m-bit CAMs, according to one embodiment. CAM 220 includes a memory array 200 and periphery circuitry 250. The memory array 200 contains data organized in rows R, each row storing multiple words. For instance, row R0 stores words A0 and B0. Both words A0 and B0 may be addressed by the address decoder 270 of the periphery circuitry 250 using the same address R0. The address decoder may additionally receive one or more bits to select one of the words among the multiple words stored in each row. For instance, a CAM that stores two words in a single row may receive one extra bit (e.g., a 0 selects the first word of the row and a 1 selects the second word of the row).

The periphery circuitry 250 includes read/write circuitry 260, a data match module 265, address decoder 270, and control module 175. The read/write circuitry 260 reads data from the memory array 200 and writes data to the memory array 200. In some embodiments, the read/write circuitry 260 may independently read each word from a single row of memory array 200. For instance, the read/wrote circuitry may read word A0 from row R0 independently from word B0. That is, for a 2m-bit CAM 220 being used as two m-bit CAMs, the read/write circuitry 260 of the 2m-bit CAM 220 is capable of independently reading and/or writing to each of the two m-bit CAMs without affecting the data stored in the other m-bit CAM. As such, both m-bit CAMs may share the same read/write circuitry 260 reducing the overall size of chip including the two m-bit CAMs.

Similarly, the data match module 265, the address decoder 270 and the control module 275 may be shared between the two m-bit CAMs being combined into the wider 2m-bit CAM 220.

Figure 3A:
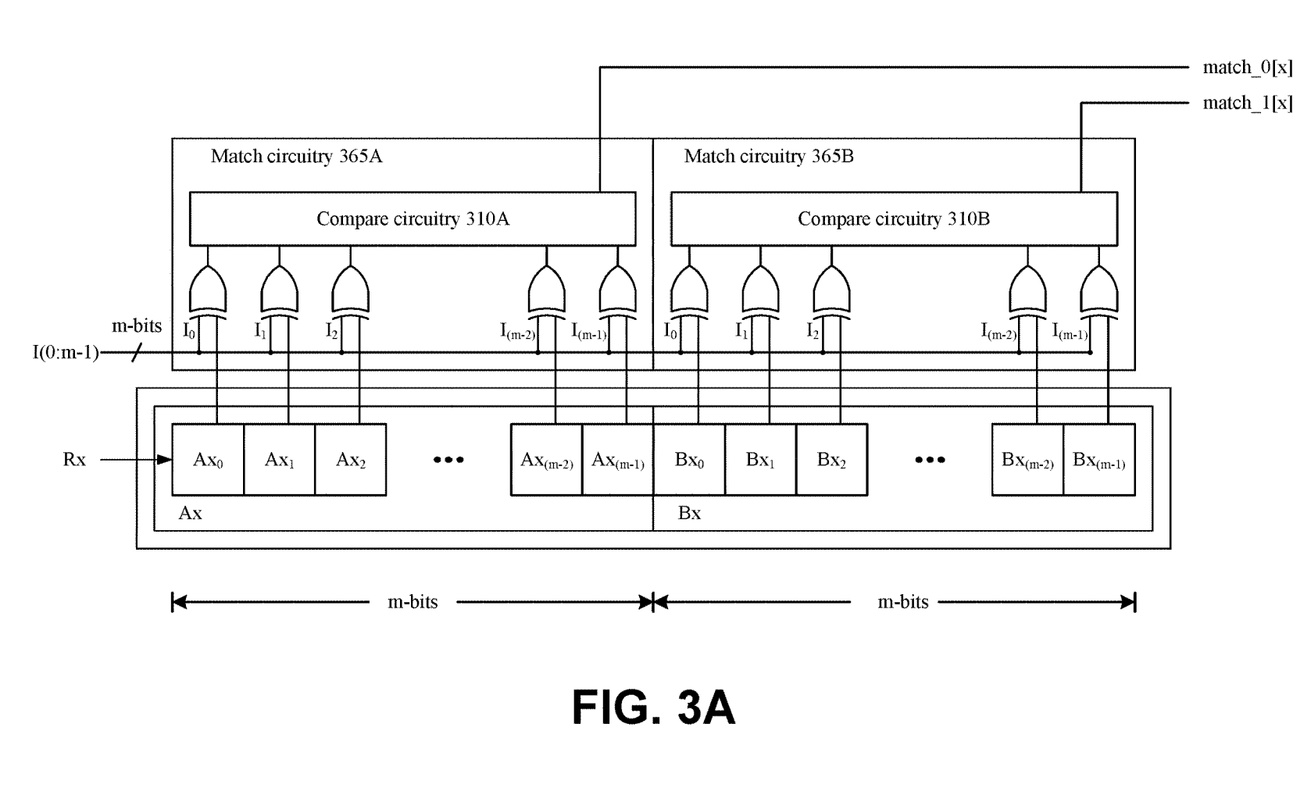
FIGS. 3A and 3B are block diagrams of a CAM row and the match circuitry for the CAM row, according to different embodiments.

FIG. 3A illustrates a block diagram of a row Rx of the memory array 200 and the corresponding match circuitry. Row Rx stores two words Ax and Bx. m-bit input word I is compared to Ax using match circuitry 365A and compared to Bx using match circuitry 365B. For instance, as seen in the exemplary embodiment of FIG. 3A, each data bit $Ax_0$, $Ax_1, \ldots, Ax_{(m-1)}$ of word Ax is compared to a corresponding bit of the m-bit input word $I_0, I_1, \ldots, I_{(m-1)}$. Compare circuitry 310A then determines whether each bit from word Ax matched the corresponding bit in the m-bit input word I and outputs the result of the determination via output match_0[x]. Similarly, each data bit $Bx_0, Bx_1, \ldots, Bx_{(m-1)}$ of word Bx is compared to a corresponding bit of the m-bit input word $I_0, I_1, \ldots, I_{(m-1)}$. Compare circuitry 310B then determines whether each bit from word Bx matched the corresponding bit in the m-bit input word I and outputs the result of the determination via output match_1[x]. As such, each row of memory array 200 has two match outputs, each corresponding to one half of the row.

Figure 4A:
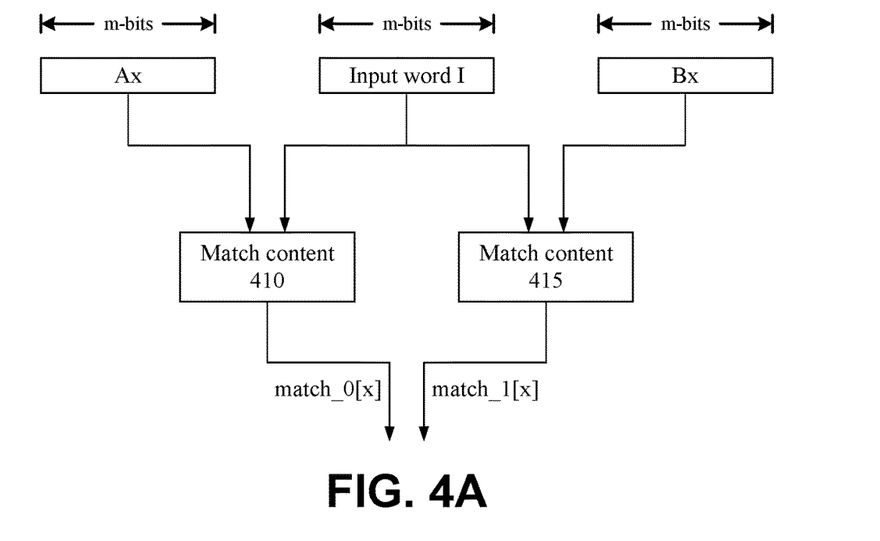
FIGS. 4A and 4B are flow diagrams for performing a match operation on a CAM, according to different embodiments.

FIG. 4A illustrates a flow diagram for performing a match operation using the CAM of FIG. 3A, according to one embodiment. An m-bit input word I is received by CAM 220. The data match module 265 compares 410 the m-bit input word I to m-bit word Ax using match circuitry 365A and generates output match_0[x] based on the comparison. The data match module 265 also compares 415 the m-bit input word I to word Bx using match circuitry 365B and generates output match_1[x] based on the comparison.

The number of match outputs that each row corresponds to the number of words that is stored in each row of memory array 200. For instance, a CAM that stores four words Ax, Bx, Cx, and Dx, could have four match outputs match_0[x], match_1[x], match_2[x], and match_3[x].

Figure 3B:
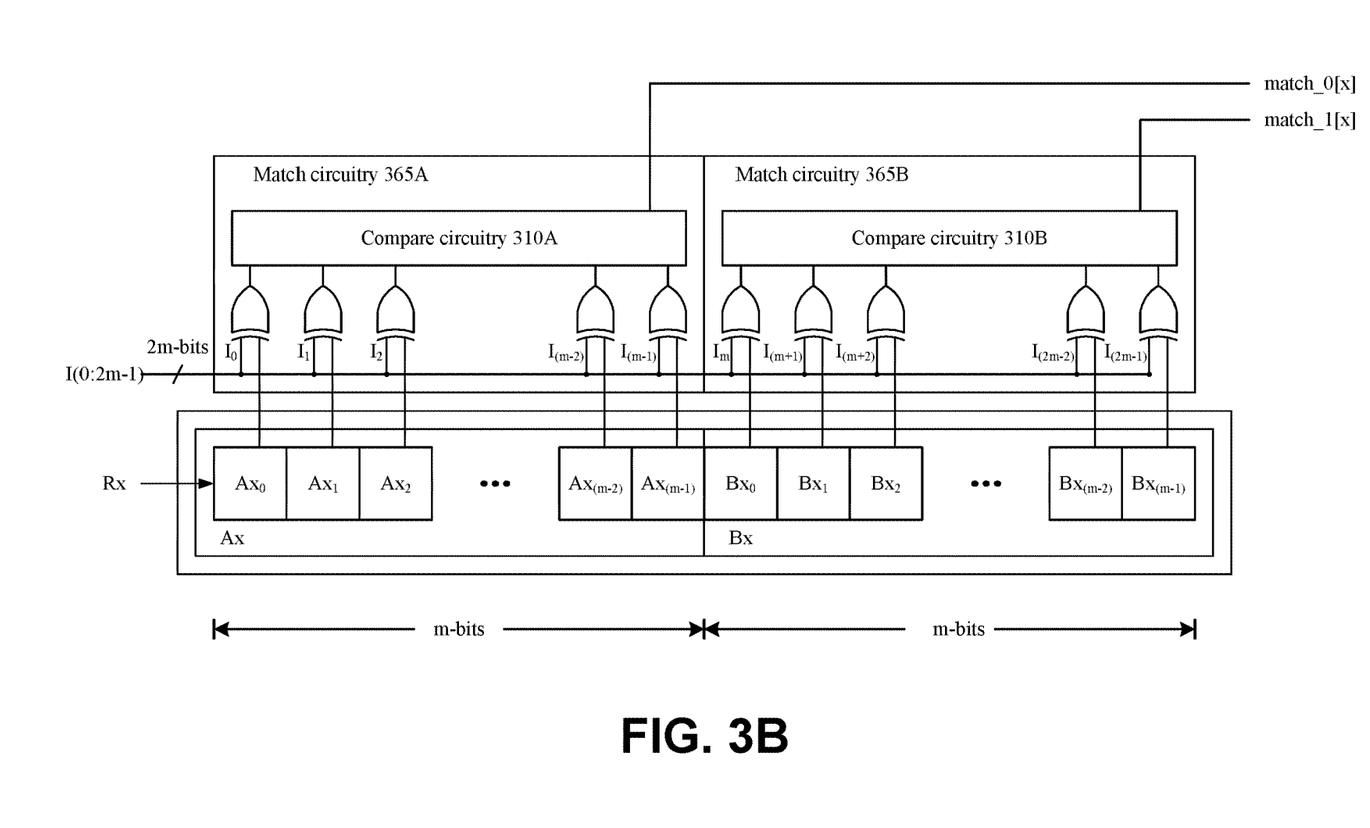

In some embodiments, the CAM may be able to compare different input words to each word Ax and Bx stored in the CAM. As illustrated in FIG. 3B, CAM 220 receives an extended input word I of length 2 m. In some embodiments, CAM 220 receives two m-bit input words and generates a 2m-bit extended input word based on the two received m-bit input words. The first m bits of the extended input word I is compared to word Ax, generating output match_0[x], and the last m bits of the extended input word I is compared to word Bx, generating output match_1[x].

Figure 4B:
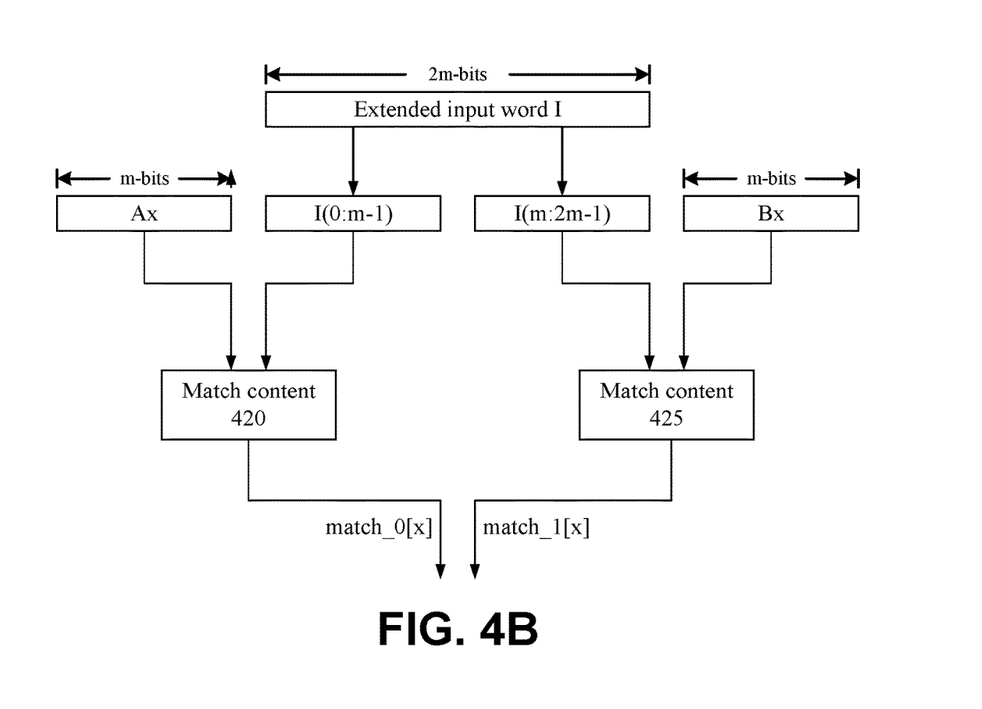

FIG. 4B illustrates a flow diagram for performing a match operation using the CAM of FIG. 3B, according to one embodiment. A 2m-bit long extended input word I is received by CAM 220. The data match module 265 compares 420 a first match word (e.g., a first m-bit portion of the extended input word I or I(0:m−1)) to word Ax using match circuitry 365A and generates output match_0[x] based on the comparison. The data match module 265, for example, compares the first m bits of the extended input word I to word Ax. The data match module 265 also compares 425 a second match word (e.g., a second m-bit portion of the extended input word I or I(m:2m−1)) to word Bx using match circuitry 365B and generates output match_1[x] based on the comparison. The data match module 265, for example, compares the last m bits of the extended input word I to word Bx.

Note that this CAM can also be used as a conventional CAM using 2m-bit words. In this case, the output match can be expressed as the AND of match_0[x] and match_1[x]. That is, if both the first m-bits and the second m-bits match, then the 2m-bits also match.

Figure 5A:
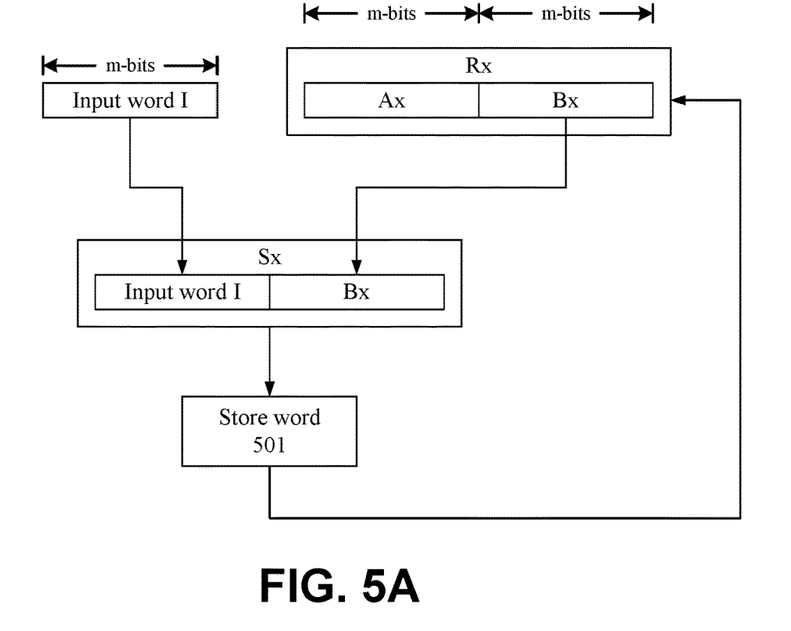
FIGS. 5A and 5B is a flow diagram of a process for storing a word in a CAM, according to one embodiment.

FIG. 5A illustrates a flow diagram of a process for storing a word in a CAM, according to one embodiment. An m-bit input word I is received by CAM 220. CAM 220 may also receive additional inputs, such as a memory address and a signal indicating which portion of the memory row (Ax or Bx) identified by the memory address the m-bit input word should be stored in. Alternatively, the CAM may receive a signal indicating which portion of a memory row (Ax or Bx) the m-bit input word should be stored in, and the CAM determines a memory address to store the m-bit input word (e.g., the first available memory row).

In the exemplary flow diagram of FIG. 5A, the m-bit input word I is to be stored in the first half of row Rx. Read/write circuitry 260 of CAM 220 reads the contents stored in memory row Rx and extracts data word Bx. Read/write circuitry 260 appends data word Bx to m-bit input word I to generate extended input word Sx. Finally, read/write circuitry 260 stores 501 extended word Sx into row Rx, overwriting the contents stored in words Ax and Bx. Alternatively, if the m-bit input word I is to be stored in the second half of row Rx, read/write circuit 260 of CAM 220 reads the contents stored in memory row Rx and extracts data word Ax. Read/write circuit 260 appends data word Ax to m-bit input word I to generate an extended input word. Finally, the read/write circuitry 260 stores the extended word Sx into row Rx, overwriting the contents stored in words Ax and Bx.

In other embodiments, CAM 220 may receive a 2m-bits long extended input word and store the extended input word in memory row Rx without reading the contents of memory row Rx. In this embodiment, CAM 220 may rely on external circuitry to retrieve the contents of row Rx from memory array 200, extract word Bx, and append word Bx to the input word to be stored before sending the extended input word to CAM 220.

Figure 5B:
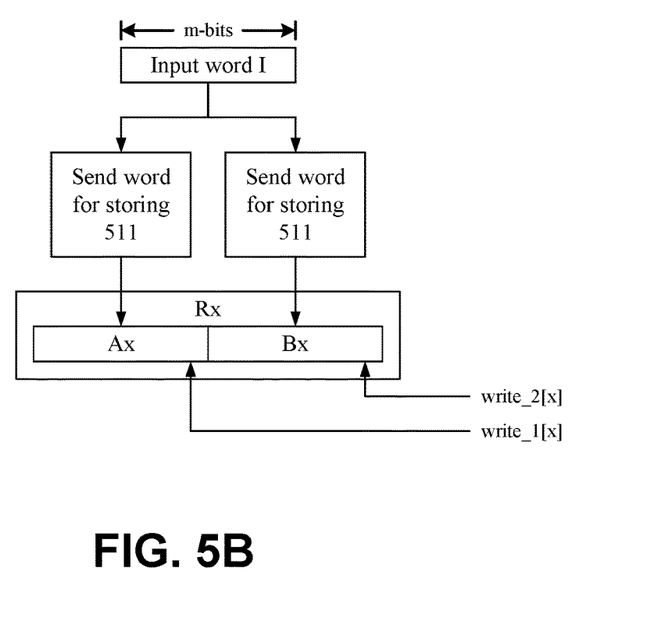

FIG. 5B illustrates a flow diagram of a process for storing a word in a CAM, according to another embodiment. An m-bit input word is received by CAM 220. CAM 220 may also receive additional inputs, such as memory address. The m-bit input word is then sent 511 to both portions (Ax and Bx) of the memory row identified by the memory address for storing. In some embodiments, each portion of a row has a write bit that enables or disables writing in that portion. If the m-bit input word is to be stored in only one portion of the row, the write bits can be used to disable the storing of the m-bit input word in one or more portions of the memory row. For instance, if the m-bit input word is to be stored in Ax, the write enable bit write_2[x] of Bx can be used to disable the storing of the m-bit input word in Bx, and the write enable bit write_1[x] of Ax can be used to enable the storing of the m-bit input word in Ax. In some embodiments, the write bits that enable or disable writing in portions of a memory row Rx are generated based on a select signal received by CAM 220 in addition to the m-bit input word. In other embodiments, the write bits are received by CAM 220 in addition to the m-bit input word.

In some embodiments, the number of match outputs is limited by metal traces used to route the match outputs from the compare circuitry 310 to the interface of the CAM 220. That is, partitioning a CAM increases the congestion of the metal lines used to route the match signals. The added metal congestion may increase the complexity in generating a layout of the CAM, and may increase the amount of parasitic capacitances. In some embodiments, the area constraints of the CAM may be relaxed to reduce the metal congestion.

The present invention advantageously reduces the power consumption and area occupied by system that includes multiple CAMs. For instance a 256×72 CAM may consume around 60% to 70% of the power consumed by two 25×36 CAMs, and may occupy around 70% of the area occupied by two 256×36 CAMs.

In another aspect, CAMs may be provided as macro blocks for inclusion into larger chip designs. Thus, one company may be designing a chip that requires CAMs. Instead of designing the CAMs itself, the company (customer) licenses CAM macro blocks from an IP vendor. The IP vendor may provide a CAM macro block that includes multiple match outputs per memory row. This will save the customer time because he does not have to design these components or integrate them with a CAM that does not have them.

In some embodiments, the IP vendor may provide a CAM compiler to generate the design of a CAM based on parameters specified by the customer. For example, the customer may specify the number of bits per word, the number of entries or words in the CAM, etc. The customer may also specify the number of match outputs per memory row. The memory compiler then generates the memory array 200, the data match module 265, the read/write circuitry 260, and other associated periphery circuitry.

In some implementations of the CAM, certain logic components may be implemented as macro blocks, which typically are laid out by hand and provided by the IP vendor. Other components may be implemented as a wrapper, which typically is synthesized from RTL and may be provided by either the IP vendor or the customer. For instance, the read/write circuitry 260 and the data match module 265 are often included as part of a CAM macro block, while the address decoder 270 and the control module 275 may be included as part of the wrapper. In another example the address decoder 270 and the control module 275 may also be included in the wrapper.

Although the detailed description contains many specifics, these should not be construed as limiting the scope of the invention but merely as illustrating different examples and aspects of the invention. It should be appreciated that the scope of the invention includes other embodiments not discussed in detail above. Various other modifications, changes and variations which will be apparent to those skilled in the art may be made in the arrangement, operation and details of the method and apparatus of the present invention disclosed herein without departing from the spirit and scope of the invention, as defined in the appended claims. Therefore, the scope of the invention should be determined by the appended claims and their legal equivalents. Furthermore, no element, component or method step is intended to be dedicated to the public regardless of whether the element, component or method step is explicitly recited in the claims.

In the claims, reference to an element in the singular is not intended to mean "one and only one" unless explicitly stated, but rather is meant to mean "one or more." In addition, it is not necessary for a device or method to address every problem that is solvable by different embodiments of the invention in order to be encompassed by the claims.

What is claimed is:

1. A content addressable memory (CAM) comprising:
   a memory array comprising a plurality of memory rows, each memory row configured to store a first data word and a second data word, the second data word different than the first data word; and
   a data match module comprising:
   a first match circuitry configured to compare a first match word to the first data word of a memory row, and to generate a first match output based on the comparison between the first match word and the first data word of the memory row, the first match word based on an input word received by the CAM; and
   a second match circuitry configured to compare a second match word to the second data word of the memory row, and to generate a second match output based on the comparison between the second match word and the second data word of the memory row, the second match word based on the input word received by the CAM.

2. The CAM of claim 1, wherein the first data word and the second data word have a same length.

3. The CAM of claim 1, wherein the input word has a length equal to or greater than a sum of a length of the first data word and a length of the second data word; and wherein the first match word is a first portion of the input word, and the second match word is a second portion of the input word.

4. The CAM of claim 3, wherein the extended input word is at least twice as wide as the first data word.

5. The CAM of claim 3, wherein the first match word and the second match word are equal to the input word.

6. The CAM of claim 1, further comprising read/write circuitry configured to:
receive an input word and a selection signal for the input word, the input word to be stored in a memory row of the memory array, and the selection signal selecting either the first data word of the memory row or the second data word of the memory row for storage of the input word;
responsive to the selection signal selecting the first data word of the memory word:
retrieving the second data word of the memory row,
combining the input word with the second data word to generate a first extended input word, and
storing the first extended input word in the memory row; and
responsive to the selection signal selecting the second data word of the memory word:
retrieving the first data word of the memory row,
combining the first data word with the input word to generate a second extended input word, and
storing the second extended input word in the memory row.

7. The CAM of claim 1, further comprising read/write circuitry configured to:
receive an input word and a selection signal for the input word, the input word to be stored in a memory row of the memory array, and the selection signal selecting either the first data word of the memory row or the second data word of the memory row for storage of the input word;
responsive to the selection signal selecting the first data word of the memory row, asserting write enable for the first data word of the memory row and not for the second data word of the memory row;
responsive to the selection signal selecting the second data word of the memory row asserting write enable for the second data word of the memory row and not for the first data word of the memory row; and
writing the input word to one of the data words within the memory row according to the write enable.

8. A non-transitory computer readable storage medium storing a digital design of a content addressable memory (CAM), the digital design of the CAM comprising:
a memory array comprising a plurality of memory rows, each memory row configured to store a first data word and a second data word, the second data word different than the first data word; and
a data match module comprising:
a first match circuitry configured to compare a first match word to the first data word of a memory row, and to generate a first match output based on the comparison between the first match word and the first data word of the memory row, the first match word based on an input word received by the CAM; and
a second match circuitry configured to compare a second match word to the second data word of the memory row, and to generate a second match output based on the comparison between the second match word and the second data word of the memory row, the second match word based on the input word received by the CAM.

9. The non-transitory computer readable storage medium of claim 8, wherein the first data word and the second data word have a same length.

10. The non-transitory computer readable storage medium of claim 8, wherein the input word has a length equal to or greater than a sum of a length of the first data word and a length of the second data word; and wherein the first match word is a first portion of the input word, and the second match word is a second portion of the input word.

11. The non-transitory computer readable storage medium of claim 10, wherein the extended input word is at least twice as wide as the first data word.

12. The non-transitory computer readable storage medium of claim 10, the first match word and the second match word are equal to the input word.

13. The non-transitory computer readable storage medium of claim 8 wherein the digital representation of the CAM further comprises read/write circuitry configured to:
receive an input word and a selection signal for the input word, the input word to be stored in a memory row of the memory array, and the selection signal selecting either the first data word of the memory row or the second data word of the memory row for storage of the input word;
responsive to the selection signal selecting the first data word of the memory word:
retrieving the second data word of the memory row,
combining the input word with the second data word to generate a first extended input word, and
storing the first extended input word in the memory row; and
responsive to the selection signal selecting the second data word of the memory word:
retrieving the first data word of the memory row,
combining the first data word with the input word to generate a second extended input word, and
storing the second extended input word in the memory row.

14. The non-transitory computer readable storage medium of claim 8 wherein the digital representation of the CAM further comprises read/write circuitry configured to:
receive an input word and a selection signal for the input word, the input word to be stored in a memory row of the memory array, and the selection signal selecting either the first data word of the memory row or the second data word of the memory row for storage of the input word;
responsive to the selection signal selecting the first data word of the memory row asserting write enable for the first data word of the memory row and not for the second data word of the memory row;
responsive to the selection signal selecting the second data word of the memory row asserting write enable for the second data word of the memory row and not for the first data word of the memory row; and
writing the input word to one of the data words within the memory row according to the write enable.

* * * * *

UNITED STATES PATENT AND TRADEMARK OFFICE
CERTIFICATE OF CORRECTION

PATENT NO. : 10,032,516 B2
APPLICATION NO. : 15/621954
DATED : July 24, 2018
INVENTOR(S) : Dennis Dudeck It is certified that error appears in the above-identified patent and that said Letters Patent is hereby corrected as shown below:

In the Claims

Column 7, Line(s): 10, Claim 4, delete "extended".
Column 7, Line(s): 11, Claim 4, delete "wide" and insert -- long --.
Column 7, Line(s): 23, Claim 6, delete "memory word" and insert -- memory row --.
Column 7, Line(s): 31, Claim 6, delete "memory word" and insert -- memory row --.
Column 8, Line(s):18, Claim 11, delete "extended".
Column 8, Line(s):19, Claim 11, delete "wide" and insert -- long --.
Column 8, Line(s): 33, Claim 13, delete "memory word" and insert -- memory row --.
Column 8, Line(s): 40, Claim 13, delete "memory word" and insert -- memory row --.

Signed and Sealed this
Ninth Day of July, 2019

Andrei Iancu
*Director of the United States Patent and Trademark Office*